United States Patent
Nagatomo

[19]

[11] Patent Number: 6,115,297
[45] Date of Patent: Sep. 5, 2000

[54] SEMICONDUCTOR MEMORY CIRCUIT WITH A CONTROL CIRCUIT RISING CELL DRAIN POTENTIAL SLOWLY

[75] Inventor: Masahiko Nagatomo, Miyazaki, Japan

[73] Assignee: Oki Electric Industry Co., Ltd., Tokyo, Japan

[21] Appl. No.: 09/333,581

[22] Filed: Jun. 15, 1999

[30] Foreign Application Priority Data

Jun. 17, 1998  [JP]  Japan ................................. 10-170135

[51] Int. Cl.⁷ ...................................................... G11C 7/00
[52] U.S. Cl. ................. 365/194; 365/189.09; 365/185.26
[58] Field of Search ............................... 365/189.09, 194, 365/185.26, 230.06

[56] References Cited

U.S. PATENT DOCUMENTS

| | | | |
|---|---|---|---|
| 5,602,789 | 2/1997 | Endoh et al. ............................ | 365/201 |
| 5,796,657 | 8/1998 | Lee et al. ............................ | 365/185.11 |
| 5,812,440 | 9/1998 | Suminaga et al. ........................ | 365/51 |
| 5,821,909 | 10/1998 | Yiu et al. ............................ | 365/185.14 |
| 5,862,734 | 2/1999 | Tanaka et al. ...................... | 365/185.24 |

FOREIGN PATENT DOCUMENTS 7-30076   1/1995  Japan .
7-307093  11/1995  Japan .

*Primary Examiner*—David Nelms
*Assistant Examiner*—Thong Le
*Attorney, Agent, or Firm*—Jones Volentine, LLP

[57] ABSTRACT

A semiconductor memory circuit includes a memory cell subarray, a subarray driver and a cell drain potential generator. The memory cell subarray includes word lines, memory cell transistors and a cell drain line selection transistor. Each of the memory cell transistors has a gate connected to one of the word lines, a drain and a source. The cell drain line selection transistor has a first terminal connected to the drains of the memory cell transistors, a second terminal and a gate. The semiconductor memory circuit further has a subarray driver connected to the gate of the cell drain line selection transistor for applying a predetermined potential to the cell drain line selection transistor in response to a write control signal and an address signal, and a cell drain potential generator connected to the second terminal of the cell drain line selection transistor for providing a cell drain potential to the second terminal of the cell drain line selection transistor in response to the write control signal. The cell drain potential generator has a delay circuit for slowly rising the cell drain potential.

30 Claims, 7 Drawing Sheets

SEMICONDUCTOR MEMORY CIRCUIT WITH A CONTROL CIRCUIT RISING CELL DRAIN POTENTIAL SLOWLY

BACKGROUND OF THE INVENTION

1. Field of the Invention

This invention relates to a semiconductor memory circuit, and particularly to a data write circuit suitable for use in a ROM such as an EPROM (Erasable Programmable Read Only Memory) or an OTPROM (One Time Programmable Read Only Memory).

2. Description of the Background Art

With the objective of achieving mass storage capacity of a semiconductor memory device, there has recently been a tendency to increase the number of memory cells contained in one subarray of the semiconductor memory device and increase even the number of subarrays. With their increases, cell source lines are extended in length, thus leading to an increase in the capacitive component of each cell source line. The capacitive component developed in the cell source line has brought about a possibility that upon selecting a predetermined memory cell and writing H level data therein, L level data not to be originally written would be written into each non-selected memory cell connected to a word line corresponding to the selected memory cell. In this case, cell source line selection transistors corresponding to the non-selected memory cells are turned off so that their corresponding cell source lines are respectively held in a floating state. However, when the capacitive components of these cell source lines are large, a transient current will flow in the non-selected memory cell transistors. Avalanche breakdown occurs due to the transient current so that hot electrons are injected into the floating gates of the non-selected memory cell transistors, thereby increasing threshold voltages of these transistors. Further, these transistors increase in operation minimum source voltage, so that there was a possibility that the L level data not to be written would be written into the non-selected memory cells.

SUMMARY OF THE INVENTION

With the foregoing problems in view, it is therefore an object of the present invention to provide a novel and improved data write circuit wherein even when the number of memory cells increases with the objective of achieving mass capacity of a semiconductor memory device, predetermined data is stably written into a selected memory cell and incorrect data is not written into non-selected memory cells.

A semiconductor memory circuit of the present invention comprises a memory cell subarray including word lines, memory cell transistors and a cell drain line selection transistors. Each of the memory cell transistor has a gate connected to one of the word lines, a drain and a source. The cell drain line selection transistor has a first terminal connected to the drains of the memory cell transistors, a second terminal and a gate. The semiconductor memory circuit further has a subarray driver connected to the gate of the cell drain line selection transistor for applying a predetermined potential to the cell drain line selection transistor in response to a write control signal and an address signal, and a cell drain potential generator connected to the second terminal of the cell drain line selection transistor for providing a cell drain potential to the second terminal of the cell drain line selection transistor in response to the write control signal. The cell drain potential generator has a delay circuit for slowly rising the cell drain potential.

Typical ones of various inventions of the present application have been shown in brief. However, the various inventions of the present application and specific configurations of these inventions will be understood from the following description.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Preferred embodiments of the present invention will hereinafter be described in detail with reference to the accompanying drawings.

Figure 1:
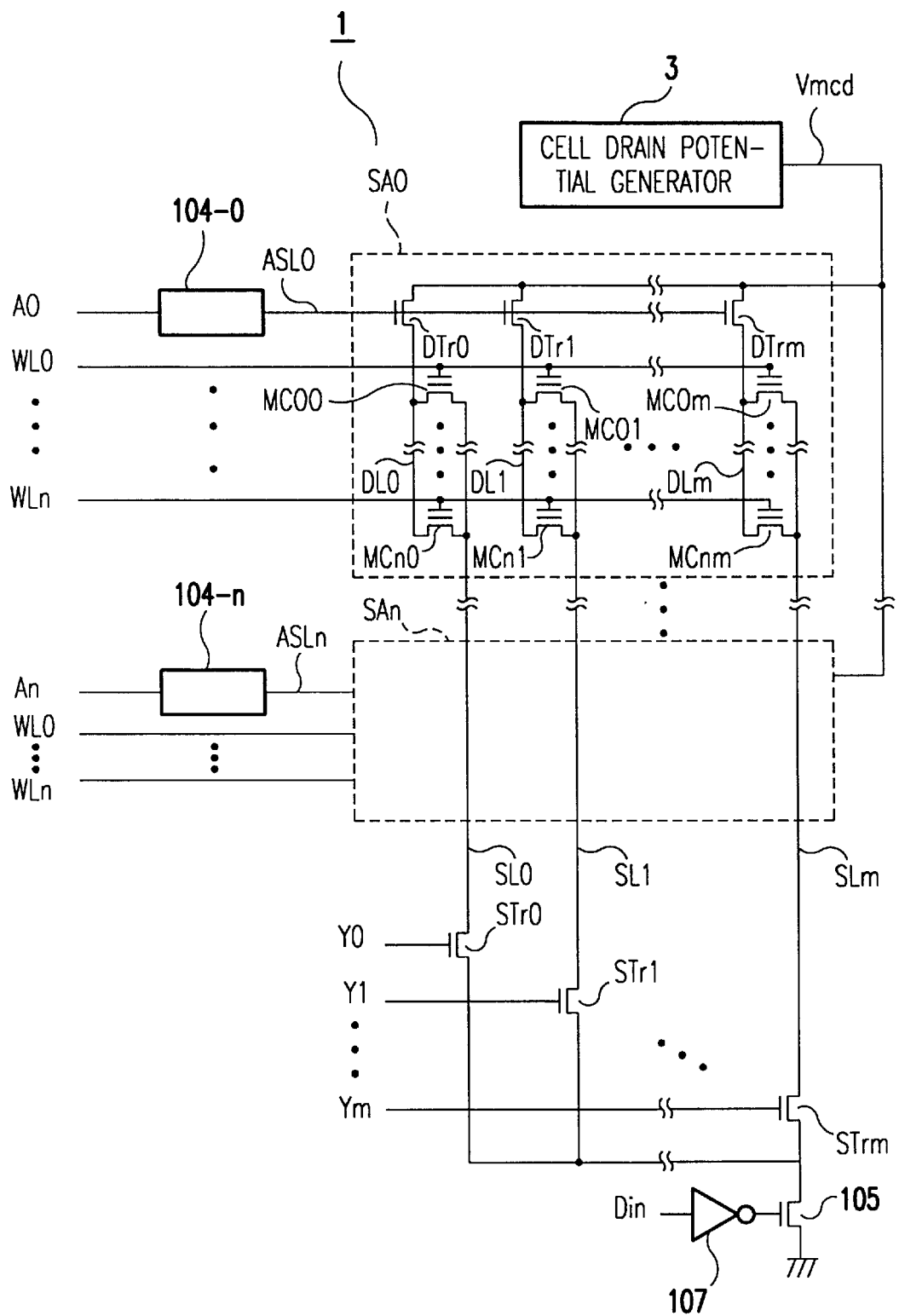
FIG. 1 is a circuit diagram showing a data write circuit according to a first embodiment of the present invention.

FIG. 1 is a circuit diagram showing a data write circuit according to a first embodiment of the present invention. The data Write circuit 1 is applied to a so-called subarray type ROM having n+1 subarrays SA0 through SAn.

The n+1 subarrays SA0 through SAn have configurations substantially identical to one another respectively. The n+1 subarrays SA0 through SAn comprise m+1 cell drain line selection transistors DTr0 through DTrm and (m+1)×(n+1) memory cells (or memory cell transistors) MC00 through MCnm respectively.

A cell drain potential generator 3 supplies a cell drain potential Vmcd to drain electrodes of the (m+1) cell drain line selection transistors DTr0 through DTrm provided within the respective subarrays SA0 through SAn.

Further, subarray drivers 104-0 through 104-n are electrically connected to their corresponding subarrays SA0 through SAn. The subarray drivers 104-0 through 104-n have the function of adjusting potentials on or applied to subarray select signal lines ASL0 through ASLn to their corresponding predetermined values, respectively.

The memory cell transistors MC00 through MCnm respectively provided within the respective subarrays SA0 through SAn are arranged in matrix form. Respective gate electrodes of the memory cell transistors MC00 through MCnm are respectively electrically connected to word lines WL0 through WLn at every rows. Respective drain electrodes of the memory cell transistors MC00 through MCnm are electrically connected to their corresponding cell drain lines DL0 through DLm at every column. Respective source electrodes of the memory cell transistors MC00 through MCnm are electrically connected to their corresponding electrically-shared cell source lines SL0 through SLm at every columns.

First ends of the respective cell source lines SL0 through SLm are electrically connected to their corresponding drain electrodes of cell source line selection transistors STr0 through STrm. Further, source electrodes of the cell source line selection transistors STr0 through STrm are electrically commonly connected to a drain electrode of a transistor 105. The transistor 105 can be on/off-controlled according to a control signal Din inputted via an inverter gate or inverter 107. Predetermined respective ones of the cell source line selection transistors STr0 through STrm are selected according to column select signals Y0 through Ym inputted to their gate electrodes.

Figure 2:
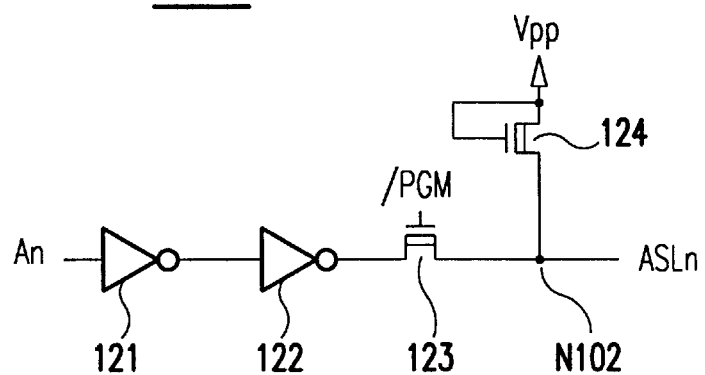
FIG. 2 is a circuit diagram showing a subarray driver of the first embodiment of the present invention.

Circuit configurations of the subarray drivers 104-0 through 104-n will next be described. The subarray drivers 104-0 through 104-n have circuit configurations substantially identical to one another respectively. The circuit configuration will be typically explained here by using the subarray driver 104-n. As shown in FIG. 2, the subarray driver 104-n comprises two inverter gates or inverters 121 and 122 and two double diffusion type transistors (hereinafter called D transistors) 123 and 124. The inverters 121 and 122 are electrically series-connected to each other. They supply an address signal An to a drain electrode of the D transistor 123.

The D transistor 123 is controlled by a write control signal /PGM so as to supply the address signal An inputted thereto via the inverters 121 and 122 to a node N102. Further, the D transistor 124 forms a diode configuration. A write potential Vpp is applied to drain and gate electrodes of the D transistor 124. A source electrode of the D transistor 124 is electrically connected to the node N102. A predetermined potential is applied to the subarray select signal line ASLNn through the node N102.

Figure 3:
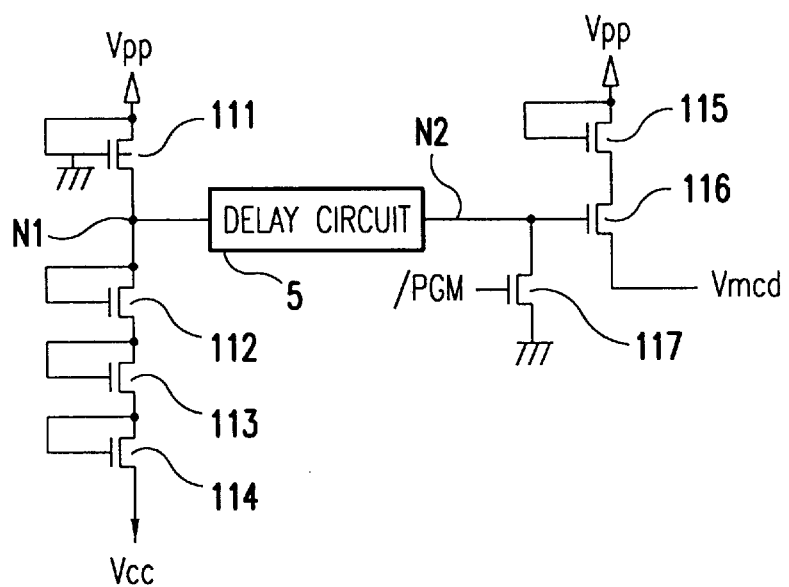
FIG. 3 is a circuit diagram showing a cell drain potential generator of the first embodiment of the present invention.

A circuit configuration of the cell drain potential generator 3 will next be explained. As shown in FIG. 3, the cell drain potential generator 3 comprises one P channel transistor 111, six N channel transistors 112, 113, 114, 115, 116 and 117, and a delay circuit 5.

The write potential Vpp (e.g., 10V) is applied to a source electrode of the P channel transistor 111. A ground potential GND is applied to a gate electrode of the P channel transistor 111. A drain electrode of the P channel transistor 111 is electrically connected to a node N1. On the other hand, the N channel transistors 112, 113 and 114 constitute serial three-stage diode coupling. The gate and drain of the N channel transistor 112 are electrically connected to the node N1. The gate and drain of the N channel transistor 113 are electrically connected to the source of the N channel transistor 112. The gate and drain of the N channel transistor 114 are electrically connected to the source of the N channel transistor 113. A source potential Vcc (e.g., 4V) is applied to the source of the N channel transistor 114. Namely, the N channel transistors 112, 113 and 114 serve as a reference potential generator.

The input of the delay circuit 5 is electrically connected to the node N1. The delay circuit 5 delays a potential developed on the node N1 a predetermined length of time and supplies the potential to a node N2 electrically connected to the output thereof. The delay circuit 5 is made up of a so-called CR circuit which comprises a resistive element and a capacitive element or a combination thereof.

The N channel transistor 115 forms a diode configuration. The write potential Vpp is applied to drain and gate electrodes of the N channel transistor 115. Further, a drain electrode of the N channel transistor 117 is electrically connected to the node N2. The ground potential GND is applied to a source electrode of the N channel transistor 117 and a write control signal /PGM is inputted to a gate electrode thereof. A gate electrode of the N channel transistor 116 is electrically connected to the node N2. A source electrode of the N channel transistor 115 is electrically connected to a drain electrode of the N channel transistor 116. A cell drain potential Vmcd corresponding to the output of the cell drain potential generator 3 is outputted from a source electrode of the N channel transistor 116.

The operation of the data write circuit 1 will next be explained.

When predetermined data is written into predetermined memory cells, the subarray drivers 104-0 through 104-n output predetermined potentials to the subarray select signal lines ASL0 through ASLn in accordance with address signals A0 through An respectively. Thus, one subarray, e.g., the subarray SA0 is selected from the n+1 subarrays SA0 through SAn. In order to write the predetermined data into each memory cell, the cell drain potential generator 3 outputs (source potential Vcc)+2×(threshold voltage Vtn of N channel transistor) as the cell drain potential Vmcd.

When the memory cell transistor MC00 included in the subarray SA0 is selected and data is written therein, the write potential Vpp is applied to the subarray select signal line ASL0 corresponding to the subarray SA0. The write potential Vpp is applied to the word line WL0 corresponding to the selected memory cell transistor MC00. Further, the corresponding column select signal Y0 is set to the source potential Vcc. The ground potential GND is applied to the subarray select signal lines ASL1 through ASLn corresponding to the subarrays SA1 through SAn other than the subarray SA0 to which the selected memory cell transistor MC00 belongs, and the word lines WL1 through WLn other than the word line WL0 corresponding to the selected memory cell transistor MC00. Further, the column select signals Y1 through Yn other than the corresponding column select signal Y0 are set to the ground potential GND. Upon reading data, one of the subarray select signal lines ASL1 through ASLn for selecting one of the subarrays SA0 through SAn is supplied with the source potential Vcc, whereas others are supplied with the ground potential GND.

When data having an L level is written into the selected memory cell transistor MC00, the transistor 105 is turned on by the control signal Din so that the ground potential GND is applied to the source electrode of the memory cell transistor MC00. Further, the write potential Vpp (10V) is applied to the gate electrode of the selected memory cell transistor MC00, and (write potential Vpp)+2×(threshold voltage Vtn of N channel transistor)©6V is applied to the drain electrode of the memory cell transistor MC00. Incidentally, the threshold voltage Vtn of the N channel transistor is defined as 1V in the present embodiment. Hot electrons produced by avalanche breakdown are injected into the floating gate of the memory cell transistor MC00 to which the predetermined potentials are applied as described above. As a result, the data having the L level is written into the memory cell transistor MC00. On the other hand, when the transistor 105 is turned off by the control signal Din, the source electrode of the memory cell transistor MC00 is brought to a floating state. Therefore, no avalanche breakdown is produced and hence no hot electrons are injected into the floating gate of the memory cell transistor MC00. Consequently, data having a high level is written into the memory cell transistor MC00.

Figure 4:
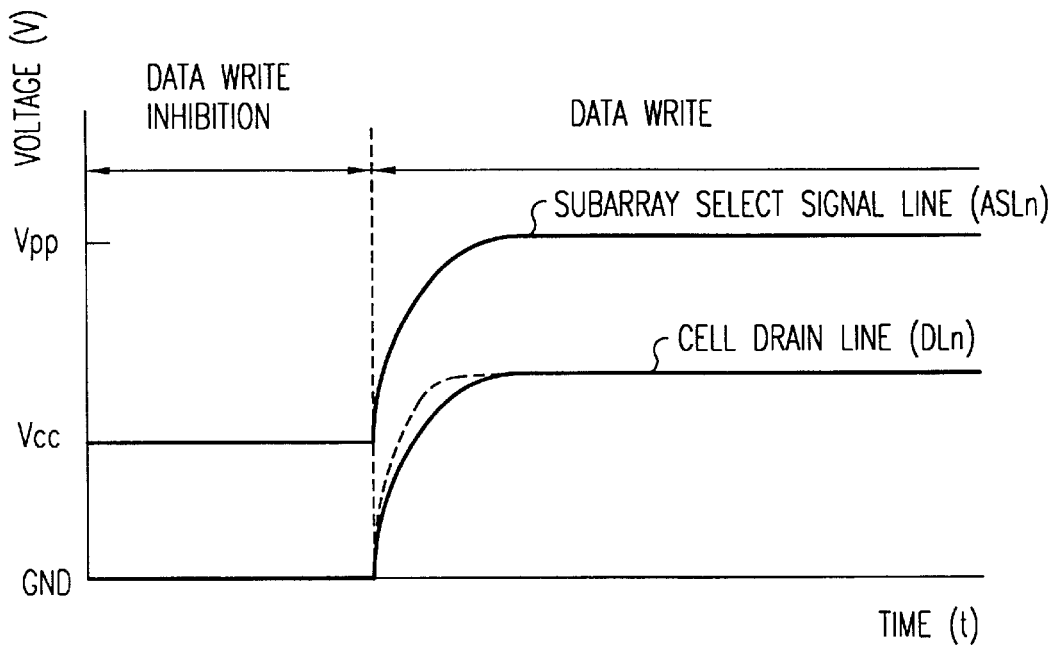
FIG. 4 is a timing chart indicating the cell drain potential and the potential applied to the subarray select signal line employed in the data write circuit according to the first embodiment of the present invention.

A description will next be made of the cell drain potential Vmcd outputted from the cell drain potential generator 3 provided in the data write circuit 1 according to the first embodiment and the potential outputted from each of the subarray drivers 104-0 through 104-n and applied to the subarray select signal line ASLn with reference to FIG. 4. Incidentally, solid lines in FIG. 4 indicate the cell drain potential Vmcd employed in the data write circuit 1 according to the first embodiment and the potential applied to the subarray select signal line ASLn, and a broken line in FIG. 4 indicates a cell drain potential employed in the conventional data write circuit.

When the write control signal /PGM is H in level, i.e., it indicates a data write inhibition state, the N channel transistor 117 is turned on. Thus, the N channel transistor 116 is turned off so that the cell drain potential Vmcd is brought to a floating state.

When the write control signal /PGM is L in level, i.e., it indicates a data write state, (source voltage Vcc)+2×(threshold voltage Vtn of N channel transistor) is applied to the node N1. A rise in the potential applied to the node N1 is delayed a predetermined time by the delay circuit 5, followed by transmission to the gate of the N channel transistor 116. Therefore, the cell drain potential Vmcd (solid line) rises gently as compared with the conventional one (dotted line).

According to the data write circuit 1 showing the first embodiment as described above, since the cell drain potential Vmcd rises slowly as compared with the conventional one upon initiation of a data write operation, charging is slowly effected on capacitive components of the cell source lines SL0 through SLm. Thus, the peak value of a transient current developed upon charging initiation is reduced and hot electrons are restrained from being produced in the non-selected memory cells. Consequently, the data is prevented from being miswritten into the non-selected memory cells.

A data write circuit according to a second embodiment will be explained. In the second embodiment, the subarray drivers 104-0 through 104-n employed in the first embodiment are replaced by subarray drivers 4-0 through 4-n. In the second embodiment as well, the cell drain potential generator 3 according to the first embodiment is replaced by a cell drain potential generator 103. The second embodiment is identical to the first embodiment in other configurations.

Figure 5:
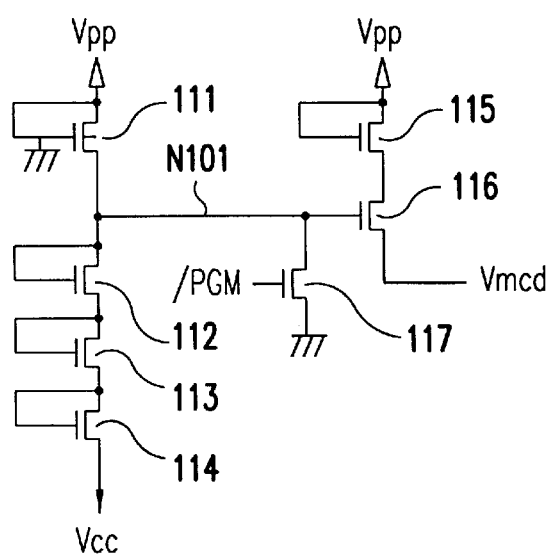
FIG. 5 is a circuit diagram showing a cell drain potential generator of the second embodiment of the present invention.

A circuit configuration of the cell drain potential generator 103 will first be described. As shown in FIG. 5, the cell drain potential generator 103 comprises one P channel transistor 111 and six N channel transistors 112, 113, 114, 115, 116 and 117. Namely, the cell drain potential generator 103 does not include the delay circuit 5 of the cell drain potential generator 3 shown in FIG. 3.

The subarray drivers 4-0 through 4-n have circuit configurations substantially identical to one another respectively. In the present embodiment, the circuit configuration will be explained by using the subarray driver 4-n. As shown in FIG. 5, the subarray driver 4-n has a circuit configuration in which a delay circuit 7 is added to the subarray driver 104-n employed in the first embodiment. In other words, the subarray driver 4-n comprises two inverter gates 121 and 122, two D transistors 123 and 124 and the delay circuit 7. Since the inverters 121 and 122 and the D transistor 123 are identical to those employed in the subarray driver 104-n, their description will be omitted.

The D transistor 124 forms a diode configuration. A write potential Vpp is applied to drain and gate electrodes of the D transistor 124. A source electrode of the D transistor 124 is electrically connected to the input of the delay circuit 7. The output of the delay circuit 7 is electrically connected to a node N3. A predetermined potential is outputted to a subarray select signal line ASLn through the node N3.

Figure 6:
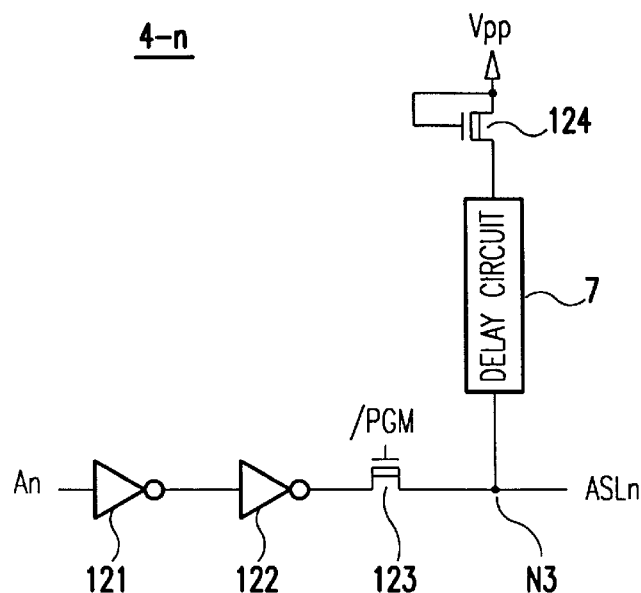
FIG. 6 is a circuit diagram showing a subarray driver of the second embodiment of the present invention.
Figure 7:
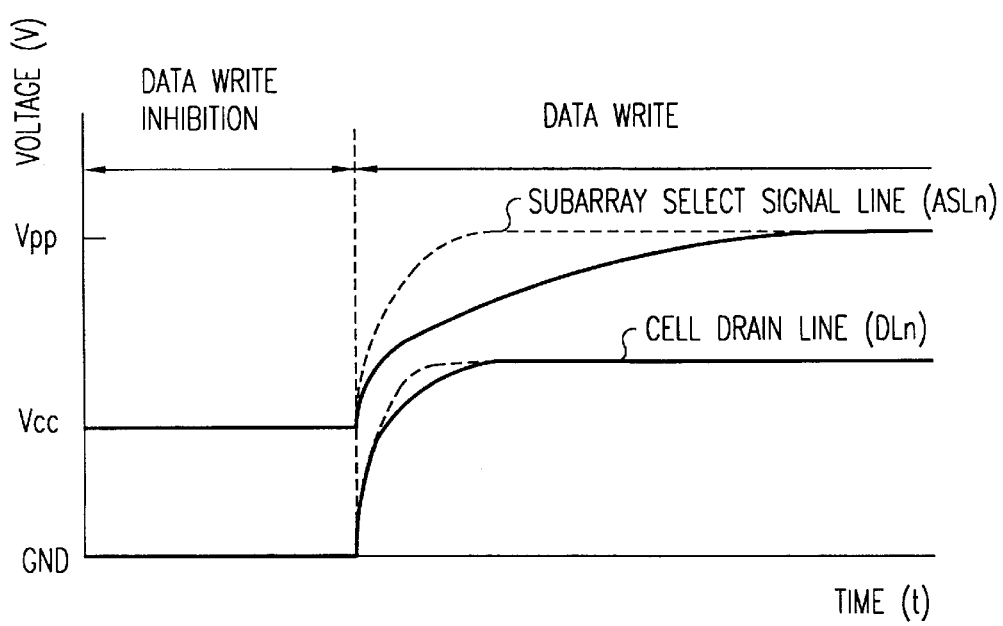
FIG. 7 is a timing chart indicating the cell drain potential and the potential applied to the subarray select signal line employed in the data write circuit according to the second embodiment of the present invention.

The operation of the data write circuit according to the second embodiment, particularly, the operation of the characteristic subarray driver 4-n will next be explained with reference to FIG. 6. The subarray driver 4-n applies the write potential Vpp to the subarray select signal line ASLn upon initiation of data writing. However, the write potential Vpp is delayed by the delay circuit 7, followed by supply to the node N3. Thus, the potential (as indicated by a solid line) applied to the subarray select signal line ASLn rises slowly as compared with the conventional one (as indicated by a dotted line). On the other hand, since the potential (indicated by a solid line) applied to a cell drain line DLn is not greater than (potential on the subarray select signal line ASLn)−(threshold voltages of cell drain line selection transistors DTr0 through DTrm), the potential on the cell drain line DLn rises slowly as compared with the conventional one (as indicated by the dotted line) according to a rise in the potential on the subarray select signal line ASLn as shown in FIG. 7.

According to the data write circuit of the second embodiment as described above, since both the potential applied to the subarray select signal line ASLn and the potential applied to the cell drain line DLn rise slowly immediately after the initiation of the data writing, the present data write circuit can bring about effects similar to those obtained by the data write circuit 1 according to the first embodiment.

Further, since the potentials on the subarray select signal lines ASL0 through ASLn have conventionally been raised relatively abruptly immediately after the initiation of the data writing, the flow of current as viewed from the write potential Vpp to the ground potential GND has occurred. This current could lead to the injection of hot electrons into the floating gates of all the memory cell transistors MC00 through MCnm. Thus, there was a possibility that data would be miswritten into each memory cell. According to the data write circuit of the second embodiment with respect to such a problem, since the potential on the subarray select signal line ASLn immediately after the writing of the data rises slowly, the flow of current into each non-selected subarray as viewed from the write potential Vpp to the ground potential GND is reduced, thus making it possible to prevent miswriting of data.

On the other hand, the cell drain potential generator 3 provided within the data write circuit 1 according to the first embodiment can be applied to the data write circuit according to the second embodiment.

In this case, the delay circuit 5 included in the cell drain potential generator 3 and the delay circuit 7 included in the subarray driver 4-n make it possible to respectively set the time required for the cell drain potential Vmcd at the instant following the data writing to rise so as to be shorter than the time required for the potential on the subarray select signal line ASLn to rise.

Figure 8:
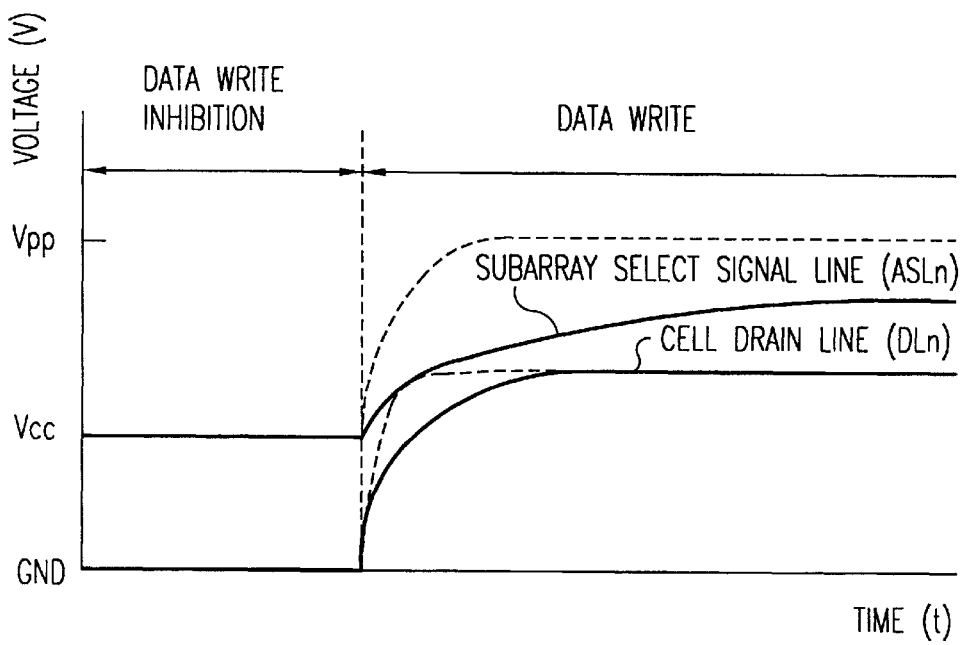
FIG. 8 is a timing chart indicating the cell drain potential and the potential applied to the subarray select signal line employed in the data write circuit according to the modified second embodiment of the present invention.

FIG. 8 shows characteristics about the potential on the subarray select signal line ASLn and the potential on the cell drain line DLn at the time that the above settings have been made. The potential on the cell drain line DLn is controlled by the cell drain potential generator 3 until the cell drain potential Vmcd reaches (potential on select signal line ASLn)–(threshold voltages of cell drain line selection transistors DTr0 through DTrm). When the cell drain potential Vmcd reaches greater than it, the potential on the cell drain line DLn is controlled by the subarray driver 4-n. Namely, the time required for the potential on the cell drain line DLn to rise can be adjusted to two stages. Described specifically, the hot electrons will not be produced in the memory cell transistors MC00 through MCnm at first. Next, the time required for the potential of the cell drain line DLn to rise is set short until the injection of the hot electrons into the floating gates thereof occurs. Thereafter, the potential is set so as to rise slowly from the instant preceding the occurrence of the avalanche breakdown. Such an adjustment allows the prevention of miswriting of the data into the memory cell transistors MC00 through MCnm and contributes even to the speeding up of data writing.

In a data write circuit showing a third embodiment, the subarray drivers 4-0 through 4-n employed in the second embodiment are respectively replaced by subarray drivers 8-0 through 8-n. The third embodiment is identical to the second embodiment in other configurations.

Figure 9:
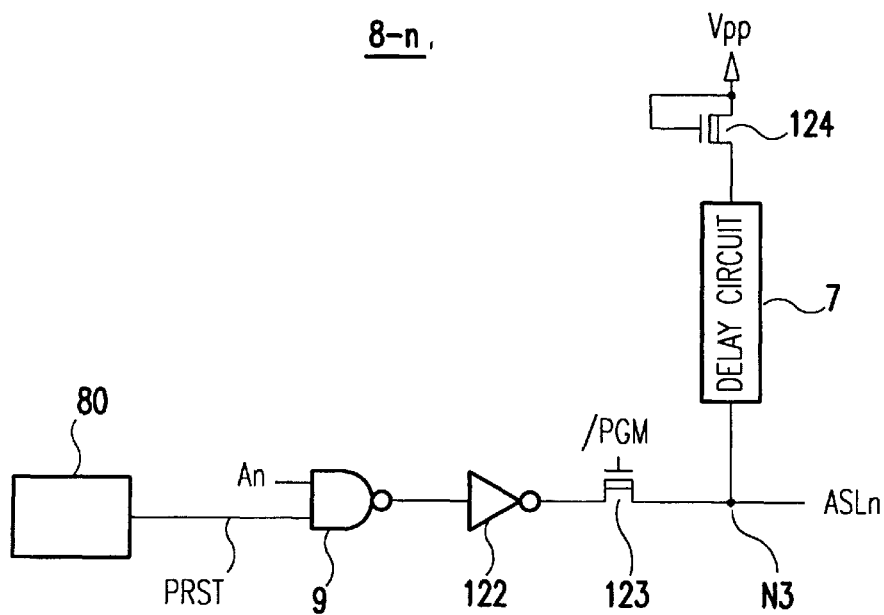
FIG. 9 is a circuit diagram showing a subarray driver of the third embodiment of the present invention.

The subarray drivers 8-0 through 8-n have circuit configurations substantially identical to one another respectively. In the present embodiment, these configurations and functions will be described by using the subarray driver 8-n. The subarray driver 8-n shown in FIG. 9 is one wherein the inverter gate 121 of the subarray driver 4-n is replaced by a NAND gate 9. In other words, the subarray driver 8-n comprises the NAND gate 9, an inverter 122, two D transistors 123 and 124 and a delay circuit 7. Since the inverter 122, D transistors 123 and 124 and delay circuit 7 are identical to those employed in the subarray driver 4-n, their description will be omitted.

An address signal An is inputted to one input terminal of the NAND gate 9 and a preset signal PRST is inputted to the other input terminal thereof. The preset signal PRST is outputted from a one-shot pulse generator 80 whose output is made active when a data writing operation is started. An output terminal of the NAND gate 9 is electrically connected to an input terminal of the inverter 122.

Figure 10:
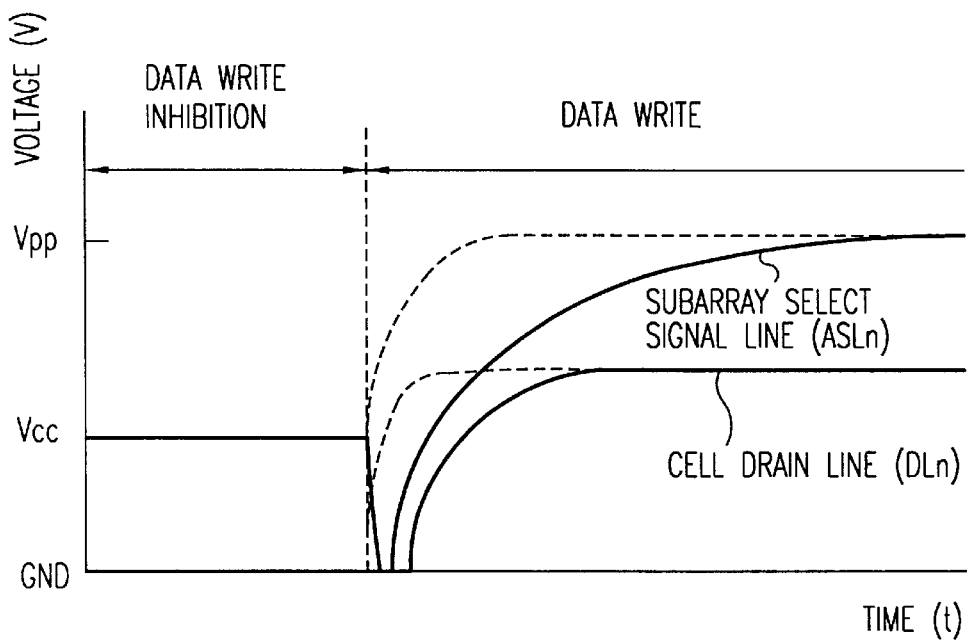
FIG. 10 is a timing chart indicating the cell drain potential and the potential applied to the subarray select signal line employed in the data write circuit according to the third embodiment of the present invention.

The operation of the data write circuit showing the third embodiment, which has the above-described subarray drivers 8-0 through B-n, will be explained with reference to FIG. 10. A preset signal PRST having an H level is inputted to the NAND gate 9 of the subarray driver 8-n at one shot upon initiation of the data writing operation. When a write control signal /PGM is thereafter brought to a L level and a write potential Vpp is supplied to a subarray select signal line ASLn through the delay circuit 7, the potential on the subarray select signal line ASLn is temporarily reduced to a ground potential GND. Therefore, the supply of the write potential Vpp to the subarray select signal line ASLn is further delayed in synergy with the effect of the delay circuit 7, so that the potential (as indicated by a solid line) on the subarray select signal line ASLn rises gently as compared with the conventional one (as indicated by a broken line). Further, the potential (as indicated by a solid line) applied to a cell drain line DLn is affected by the potential applied to the subarray select signal line ASLn and hence rises slowly as compared with the conventional one (as indicated by a dotted line).

According to the data write circuit of the third embodiment as described above, since both the potential applied to the subarray select signal line ASLn and the potential applied to the cell drain line DLn rise slowly immediately after the initiation of the data writing, the present data write circuit can bring about effects similar to those obtained by the data write circuits according to the first and second embodiments. Further, since the potential applied to the subarray select signal line ASLn is set to the ground potential GND by the subarray driver 8-n (a so-called preset operation is carried), the time required for the above potential to rise is further delayed as compared with the data write circuits showing the first and second embodiments. Thus, even when a capacitive component of a cell source line SLm further increases with an increase in the number of memory cells, the flow of a transient current into each of the memory cell transistors MC00 through MCnm at the start of the data writing is more reliably prevented from occurring, so that data is prevented from being miswritten therein.

Figure 11:
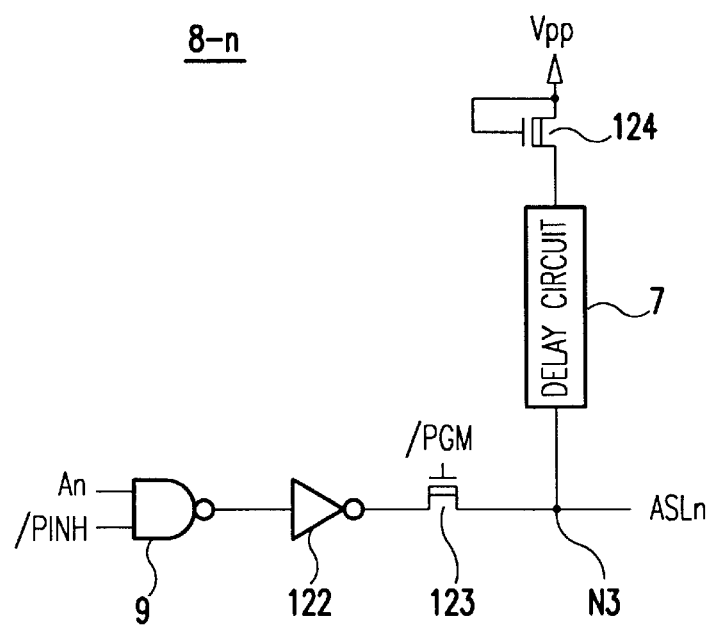
FIG. 11 is a circuit diagram showing a subarray driver of the modified third embodiment of the present invention.
Figure 12:
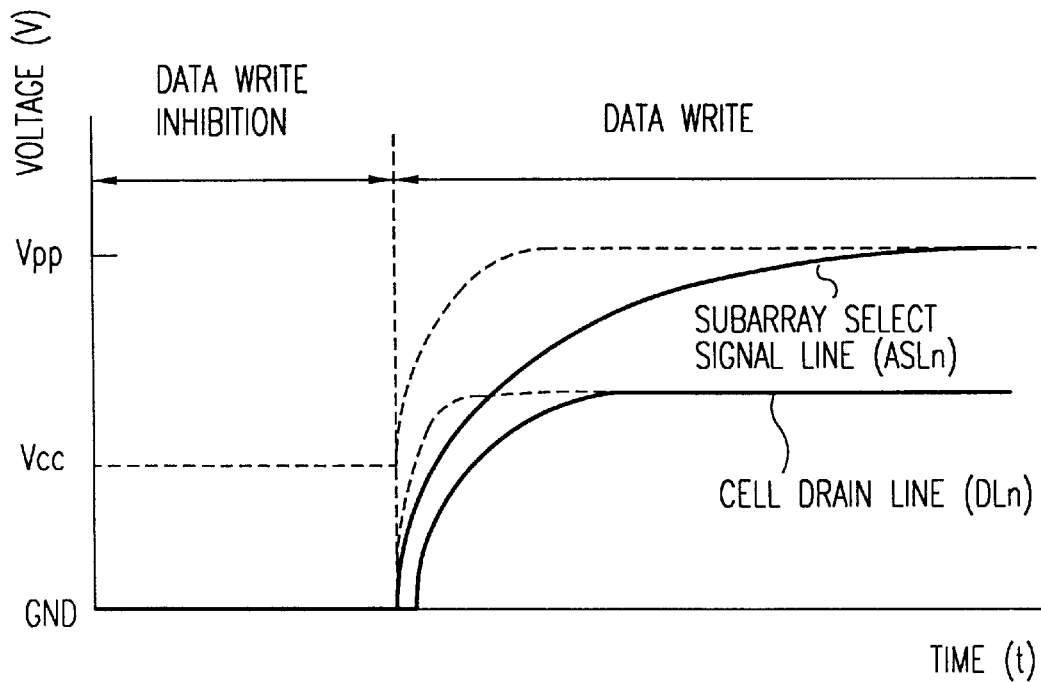
FIG. 12 is a timing chart indicating the cell drain potential and the potential applied to the subarray select signal line employed in the data write circuit according to the modified third embodiment of the present invention.

As shown in FIG. 11, a write inhibit signal /PINH may be used as an alternative to the preset signal PRST inputted to the NAND gate 9 employed in each of the above-described subarray drivers 8-0 through 8-n. The write inhibit signal /PINH is a signal set to an L level while the data is being inhibited from being written into a semiconductor memory device. Owing to this signal, the potential applied to the subarray select signal line ASLn is held at the ground potential GND as shown in FIG. 12 while the writing of the data into the semiconductor memory device is being inhibited. Thereafter, when the writing of the data therein is started, the potential applied to the subarray select signal line ASLn rises slowly and the potential applied to the cell drain line DLn rises gently with its rise. Thus, the data is prevented from being miswritten into each non-selected memory cell. Since the rising start of the potential applied to the subarray select signal line ASLn coincides with the data write start owing to the application of the write inhibit signal /PINH to the subarray driver 8-n, the time assigned to the data writing can be effectively utilized.

In a data write circuit showing a fourth embodiment, the cell drain potential generator 3 of the data write circuit 1 according to the first embodiment is replaced by a cell drain potential generator 11.

Figure 13:
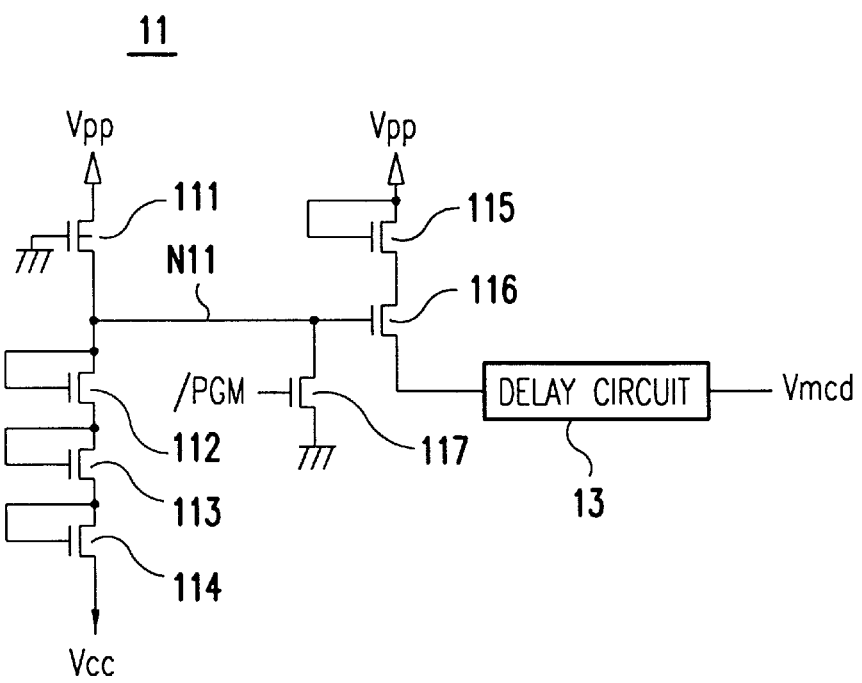
FIG. 13 is a circuit diagram showing a cell drain potential generator of the fourth embodiment of the present invention.

The cell drain potential generator 11 will be explained with reference to FIG. 13. In the cell drain potential generator 11, a delay circuit 13 is added to the cell drain potential generator 103 shown in FIG. 5. In other words, the cell drain potential generator 11 comprises one P channel transistor 111, six N channel transistors 112, 113, 114, 115, 116 and 117 and the delay circuit 13. Incidentally, the delay circuit 13 included in the cell drain potential generator 11 is made up of a CR circuit which comprises a resistive element and a capacitive element or a combination of these elements. Since a connection relationship between the transistors 111 through 115 and 117 is identical to that in the cell drain potential generator 103, its description will be omitted.

A node N11 is electrically connected to a gate electrode of the N channel transistor 116. A source electrode of the N channel transistor 115 is electrically connected to a drain electrode of the N channel transistor 116. The input of the delay circuit 13 is electrically connected to a source electrode of the N channel transistor 116. An output, i.e., a cell drain potential Vmcd of the cell drain potential generator 11 is outputted from the output of the delay circuit 13.

The data write circuit according to the fourth embodiment described above has the following effects in addition to the effects obtained by the data write circuit according to the first embodiment. While the delay circuit 5 is electrically connected to the gate electrode of the N channel transistor 116 in the cell drain potential generator 3 employed in the first embodiment, the delay circuit 13 of the cell drain potential generator 11 employed in the fourth embodiment is electrically connected to the source electrode of the N channel transistor 13. Thus, according to the data write circuit showing the fourth embodiment, the N channel transistor 116 brings a cell drain potential Vmcd corresponding to a write potential Vpp to a floating state in synchronism with timing provided to terminate a data writing operation. Owing to such an operation, a current passing through each of subarrays SA0 through SAn from the write potential Vpp can be reduced, thus making it possible to contribute to a reduction in power consumption.

While the preferred embodiments of the present invention have been described above with reference to the accompanying drawings, the present invention is not limited to such embodiments. It will be apparent to those skilled in the art that various changes or modifications can be made thereto within the scope of a technical idea as set forth in the appended claims. It should be understood that they also fall within the technical scope of the present invention.

For example, the subarray drivers 4-0 through 4-n or the subarray drivers 8-0 through 8-n can be also applied to the data write circuit showing the first or fourth embodiment.

What is claimed is:

1. A semiconductor memory circuit comprising:
   a memory cell subarray including a plurality of word lines, a plurality of memory cell transistors each having a gate connected to one of the word lines, a drain and a source, and a cell drain line selection transistor having a first terminal connected to the drains of the memory cell transistors, a second terminal and a gate;
   a subarray driver connected to the gate of the cell drain line selection transistor for applying a predetermined potential to the cell drain line selection transistor in response to a write control signal and an address signal; and
   a cell drain potential generator connected to the second terminal of the cell drain line selection transistor for providing a cell drain potential to the second terminal of the cell drain line selection transistor in response to the write control signal, said cell drain potential generator having a delay circuit for slowly raising the cell drain potential.

2. A semiconductor memory circuit according to claim 1, wherein said cell drain potential generator comprises:
   a reference potential generator for providing a reference potential;
   the delay circuit having an input terminal connected to said reference potential generator and an output terminal; and
   a cell drain potential providing circuit connected to the output terminal of the delay circuit, the cell drain potential providing circuit having a first transistor for providing the cell drain potential in response to the reference potential and a second transistor for allowing said delay circuit to transfer the reference potential to the first transistor.

3. A semiconductor memory circuit according to claim 2, wherein the first transistor has a first terminal connected to a write voltage, a second terminal providing the cell drain potential and a gate connected to the output terminal of the delay circuit, and wherein said second transistor has a first terminal connected to the output terminal of the delay circuit, a second terminal connected to ground and a gate coupled to receive the write control signal.

4. A semiconductor memory circuit according to claim 1, wherein said cell drain potential generator comprises
   a reference potential generator for providing a reference potential;
   a cell drain potential providing circuit connected to the reference potential generator, the cell drain potential providing circuit having a first transistor for providing the cell drain potential in response to the reference potential and a second transistor for allowing transfer of the reference potential to the first transistor; and
   the delay circuit having an input terminal connected to the first transistor for delaying a transfer of the cell drain potential.

5. A semiconductor memory circuit according to claim 4, wherein the first transistor has a first terminal applied to a write voltage, a second terminal connected to the delay circuit to provide the cell drain potential and a gate connected to the reference potential generator, and wherein said second transistor has a first terminal connected to the reference potential generator, a second terminal connected to ground and a gate coupled to receive the write control signal.

6. A semiconductor memory circuit according to claim 1, wherein the predetermined potential is about 10 Volts.

7. A semiconductor memory circuit according to claim 1, wherein the cell drain potential is about 6 Volts.

8. A semiconductor memory circuit according to claim 1, wherein said subarray driver further comprises a delay circuit for slowly raising the predetermined potential.

9. A semiconductor memory circuit comprising:
   a memory cell subarray including a plurality of word lines, a plurality of memory cell transistors each having a gate connected to one of the word lines, a drain and a source, and a cell drain line selection transistor having a first terminal connected to the drains of the memory cell transistors, a second terminal and a gate;
   a subarray driver connected to the gate of the cell drain line selection transistor for applying a predetermined potential to the cell drain line selection transistor in response to a write control signal and an address signal, said subarray driver having a delay circuit for slowly raising the predetermined potential; and
   a cell drain potential generator connected to the second terminal of the cell drain line selection transistor for providing a cell drain potential to the second terminal of the cell drain line selection transistor in response to the write control signal.

10. A semiconductor memory circuit according to claim 9, wherein said subarray driver comprises:

an address signal transfer circuit for outputting an address signal;

the delay circuit having an input terminal connected to receive the predetermined potential and an output terminal; and a predetermined potential providing circuit for allowing said delay circuit to transfer the predetermined potential in response to the write control signal.

11. A semiconductor memory circuit according to claim 10, wherein the predetermined potential providing circuit comprises a double diffusion type transistor having a first terminal connected to the output terminal of the delay circuit, a second terminal connected to the address signal transfer circuit and a gate coupled to receive the write control signal.

12. A semiconductor memory circuit according to claim 10, wherein the address signal transfer circuit includes a plurality of inverters connected in serial.

13. A semiconductor memory circuit according to claim 10, wherein the address signal transfer circuit includes a gate circuit having a first input terminal receiving the address signal, a second input terminal receiving a preset signal and an output terminal, and an inverter connected to the output terminal of the gate circuit.

14. A semiconductor memory circuit according to claim 13, wherein the preset signal switches to an active level when a data write period starts and is generated by a one shot pulse generator.

15. A semiconductor memory circuit according to claim 10, wherein the address signal transfer circuit includes a gate circuit having a first input terminal receiving the address signal, a second input terminal receiving a data write inhibit signal having an inactive level during a data write inhibit period and an output terminal, and an inverter connected to the output terminal of the gate circuit.

16. A semiconductor memory circuit according to claim 9, wherein said cell drain potential generator further comprises a delay circuit for slowly raising the cell drain potential.

17. A semiconductor memory circuit comprising:

a memory cell subarray including a plurality of word lines, a plurality of memory cell transistors each having a gate connected to one of the word lines, a drain and a source, and a cell drain line selection transistor having a first terminal connected to the drains of the memory cell transistors, a second terminal and a gate;

a subarray driver connected to the gate of the cell drain line selection transistor for applying a predetermined potential to the cell drain line selection transistor in response to a write control signal and an address signal; and a cell drain potential generator connected to the second terminal of the cell drain line selection transistor for providing a cell drain potential to the second terminal of the cell drain line selection transistor in response to the write control signal, said cell drain potential generator having a delay circuit so that the cell drain potential rises slowly during a data write period.

18. A semiconductor memory circuit according to claim 17, wherein said cell drain potential generator comprises:

a reference potential generator for providing a reference potential;

the delay circuit having an input terminal connected to said reference potential generator and an output terminal; and a cell drain potential providing circuit having a first transistor for providing the cell drain potential in response to the reference potential and a second transistor for allowing said delay circuit to transfer the reference potential to the first transistor.

19. A semiconductor memory circuit according to claim 18, wherein the first transistor has a first terminal applied to a write voltage, a second terminal providing the cell drain potential and a gate connected to the output terminal of the delay circuit, and wherein said second transistor has a first terminal connected to the output terminal of the delay circuit, a second terminal connected to ground and a gate coupled to receive the write control signal.

20. A semiconductor memory circuit according to claim 17, wherein said cell drain potential generator comprises:

a reference potential generator for providing a reference potential;

a cell drain potential providing circuit having a first transistor for providing the cell drain potential in response to the reference potential and a second transistor for allowing transfer of the reference potential to the first transistor; and the delay circuit having an input terminal connected to the first transistor for delaying a transfer of the cell drain potential.

21. A semiconductor memory circuit according to claim 20, wherein the first transistor has a first terminal applied to a write voltage, a second terminal connected to the delay circuit to provide the cell drain potential and a gate connected to the reference potential generator, and wherein said second transistor has a first terminal connected to the reference potential generator, a second terminal connected to ground and a gate coupled to receive the write control signal.

22. A semiconductor memory circuit according to claim 17, wherein said subarray driver further comprises a delay circuit for slowly raising the predetermined potential.

23. A semiconductor memory circuit comprising:

a memory cell subarray including a plurality of word lines, a plurality of memory cell transistors each having a gate connected to one of the word lines, a drain and a source, and a cell drain line selection transistor having a first terminal connected to the drains of the memory cell transistors, a second terminal and a gate;

a subarray driver connected to the gate of the cell drain line selection transistor for applying a predetermined potential to the cell drain line selection transistor in response to a write control signal and an address signal, said subarray driver having a delay circuit so that the predetermined potential rises slowly during a data write period; and a cell drain potential generator connected to the second terminal of the cell drain line selection transistor for providing a cell drain potential to the second terminal of the cell drain line selection transistor in response to the write control signal.

24. A semiconductor memory circuit according to claim 23, wherein said subarray driver comprises:

an address signal transfer circuit for outputting an address signal;

the delay circuit having an input terminal connected to receive the predetermined potential and an output terminal; and a predetermined potential providing circuit for allowing said delay circuit to transfer the predetermined potential in response to the write control signal.

25. A semiconductor memory circuit according to claim 24, wherein the predetermined potential providing circuit comprises a double diffusion type transistor having a first terminal connected to the output terminal of the delay circuit, a second terminal connected to the address signal transfer circuit and a gate coupled to receive the write control signal.

26. A semiconductor memory circuit according to claim 24, wherein the address signal transfer circuit includes a plurality of inverters connected in serial.

27. A semiconductor memory circuit according to claim 24, wherein the address signal transfer circuit includes a gate circuit having a first input terminal receiving the address signal, a second input terminal receiving a preset signal and an output terminal, and an inverter connected to the output terminal of the gate circuit.

28. A semiconductor memory circuit according to claim 27, wherein the preset signal switches to an active level when the data write period starts and is generated by a one shot pulse generator.

29. A semiconductor memory circuit according to claim 24, wherein the address signal transfer circuit includes a gate circuit having a first input terminal receiving the address signal, a second input terminal receiving a data write inhibit signal having an inactive level during a data write inhibit period and an output terminal, and an inverter connected to the output terminal of the gate circuit.

30. A semiconductor memory circuit according to claim 23, wherein said cell drain potential generator further comprises a delay circuit for slowly raising the cell drain potential.

* * * * *